United States Patent
Yanagihara et al.

(10) Patent No.: US 8,344,463 B2
(45) Date of Patent: Jan. 1, 2013

(54) BIDIRECTIONAL SWITCH

(75) Inventors: Manabu Yanagihara, Osaka (JP); Kazushi Nakazawa, Toyama (JP); Tatsuo Morita, Kyoto (JP); Yasuhiro Uemoto, Shiga (JP)

(73) Assignee: Panasonic Corporation, Osaka (JP)

( * ) Notice: Subject to any disclaimer, the term of this patent is extended or adjusted under 35 U.S.C. 154(b) by 348 days.

(21) Appl. No.: 12/681,567

(22) PCT Filed: Jul. 10, 2009

(86) PCT No.: PCT/JP2009/003255
§ 371 (c)(1),
(2), (4) Date: Apr. 2, 2010

(87) PCT Pub. No.: WO2010/047016
PCT Pub. Date: Apr. 29, 2010

(65) Prior Publication Data
US 2010/0213503 A1     Aug. 26, 2010

(30) Foreign Application Priority Data
Oct. 21, 2008    (JP) ................. 2008-270917

(51) Int. Cl.
*H01L 27/88*    (2006.01)
(52) U.S. Cl. ............. 257/401; 257/365; 257/E29.029; 257/E29.041; 257/471; 257/E29.039; 257/141; 257/167; 257/162
(58) Field of Classification Search ............ 257/E29.029, 257/E29.041, E47.1, E29.039, E29.1, 13, 257/141, 162, 167, 270, 287, 365
See application file for complete search history.

(56) References Cited

U.S. PATENT DOCUMENTS

| 4,972,237 | A | 11/1990 | Kawai |
| 6,114,732 | A | 9/2000 | Sugimura et al. |
| 6,268,632 | B1 * | 7/2001 | Sugimura et al. ............. 257/365 |
| 2005/0189561 | A1 | 9/2005 | Kinzer et al. |
| 2005/0189562 | A1 | 9/2005 | Kinzer et al. |
| 2007/0181934 | A1 | 8/2007 | Hu et al. |

(Continued)

FOREIGN PATENT DOCUMENTS

JP           02-002179           1/1990

(Continued)

OTHER PUBLICATIONS

T. Morita et al., "650V 3.1Ωcm2 GaN-based Monolithic Bidirectional Switch Using Normally-off Gate Injection Transistor," International Electron Devices Meeting, 2007, p. 865.

*Primary Examiner* — Ha Tran T Nguyen
*Assistant Examiner* — Aaron Dehne
(74) *Attorney, Agent, or Firm* — McDermott Will & Emery LLP

(57) ABSTRACT

A bidirectional switch includes a plurality of unit cells 11 including a first ohmic electrode 15, a first gate electrode 17, a second gate electrode 18, and a second ohmic electrode 16. The first gate electrodes 15 are electrically connected via a first interconnection 31 to a first gate electrode pad 43. The second gate electrodes 18 are electrically connected via a second interconnection 32 to a second gate electrode pad 44. A unit cell 11 including a first gate electrode 17 having the shortest interconnect distance from the first gate electrode pad 43 includes a second gate electrode 18 having the shortest interconnect distance from the second gate electrode pad 44.

11 Claims, 10 Drawing Sheets

U.S. PATENT DOCUMENTS

2008/0211567 A1 * 9/2008 Morita et al. ................. 327/425

FOREIGN PATENT DOCUMENTS

| | | |
|---|---|---|
| JP | 06-005849 | 1/1994 |
| JP | 08-008441 | 1/1996 |
| JP | 10-256562 | 9/1998 |
| WO | WO 85/002061 | 5/1985 |
| WO | WO 2005/079293 A2 | 9/2005 |
| WO | WO 2005/079370 A2 | 9/2005 |

* cited by examiner (a)

(b)

(a)

(b)

(a)

(b)

(a)

(b)

BIDIRECTIONAL SWITCH

RELATED APPLICATIONS

This application is the U.S. National Phase under 35 U.S.C. §371 of International Application No. PCT/JP2009/003255, filed on Jul. 10, 2009, which in turn claims the benefit of Japanese Application No. 2008-270917, filed on Oct. 21, 2008, the disclosures of which Applications are incorporated by reference herein.

TECHNICAL FIELD

The present invention relates to bidirectional switches, and more particularly, to bidirectional switches with a double gate structure which include a wide band gap semiconductor.

BACKGROUND ART

In recent years, nitride-based semiconductors, typified by gallium nitride (GaN), and wide band gap semiconductors, such as silicon carbide (SiC), have been actively studied and developed as materials for semiconductor devices. Wide band gap semiconductors have a breakdown field greater than that of silicon (Si) semiconductors by an order of magnitude. When conventional Si semiconductors are used to obtain a power semiconductor device having a high breakdown voltage, the power semiconductor device needs to have a long drift layer in which electrons travel. However, when nitride-based semiconductors or SiC is used, an equal breakdown voltage can be achieved by a drift layer having a length which is about ⅒ compared to when Si semiconductors are used. When a current is passed through the semiconductor device, the drift layer becomes a resistor layer. Therefore, the on-resistance of the semiconductor device can be reduced by using a wide band gap semiconductor which has a greater breakdown field and therefore can provide a shorter drift layer. The on-resistance of a semiconductor device having a predetermined breakdown voltage is inversely proportional to the third power of the breakdown field if the semiconductor material has the same mobility and permeability.

Nitride semiconductors such as GaN and the like can be used together with aluminum nitride (AlN), indium nitride (InN) or the like to produce various compounds. Therefore, nitride semiconductors can be used to produce a heterojunction as with conventional arsenide-based semiconductor materials such as gallium arsenide (GaAs) and the like. In particular, in the heterojunction of nitride semiconductors, a high concentration of carriers are generated at the interface by spontaneous polarization or piezoelectric polarization even in the absence of doping with an impurity. As a result, nitride semiconductors can be used to achieve high power devices which are lateral devices in which a current is caused to flow in a direction parallel to the substrate, and which have a low on-resistance and which can flow a large current.

Moreover, by introducing into lateral devices a double gate structure in which a first gate electrode and a second gate electrode are provided between a first ohmic electrode and a second ohmic electrode, it is possible to achieve bidirectional switches in which a current flows bidirectionally and a high breakdown voltage is bidirectionally provided.

Bidirectional switches for use in matrix converters, drive circuits for plasma display panels (PDPs), and the like have been generally developed using a reverse blocking insulated gate bipolar transistor (IGBT). However, when the reverse blocking IGBT is applied to bidirectional switches, two reverse blocking IGBTs needs to be arranged in an antiparallel fashion. Because IGBTs intrinsically have a turn-on voltage across the PN junction, the on-resistance is large in a region in which a small current flows, resulting in a large power loss during switching.

In bidirectional switches having a double gate structure, as shown in FIG. 11(a), when a bias voltage is simultaneously applied to a first gate electrode G1 and a second gate electrode G2, a current can be caused to flow bidirectionally between a first ohmic electrode S1 and a second ohmic electrode S2 without a rising voltage. As shown in FIG. 11(b), when a bias voltage is applied to only one of the two gate electrodes, rectification is performed in which a current flows only in one direction. Therefore, a bidirectional switch which has a low power loss during switching can be achieved using a single chip (see, for example, Non-Patent Document 1).

In bidirectional switches having a double gate structure, a large gate width is required for a large current. As a technique of increasing the gate width, a chip layout has been studied in which a plurality of unit cells in which a first gate electrode and a second gate electrode are provided between a first ohmic electrode and a second ohmic electrode are arranged in parallel (see, for example, Patent Document 1). As a result, a limited area can be efficiently used to easily increase the gate width.

CITATION LIST

Patent Document

PATENT DOCUMENT 1: Japanese National Phase PCT Laid-Open Publication No. 2007-526633

Non-Patent Document

NON-PATENT DOCUMENT 1: T. Morita, et al., "650V 3.1 mΩcm2 GaN-based Monolithic Bidirectional Switch Using Normally-off Gate Injection Transistor," International Electron Devices Meeting, 2007, p. 865

SUMMARY OF THE INVENTION

Technical Problem

However, it has been clarified that the layout of the aforementioned conventional bidirectional switch has the following problem.

In the conventional bidirectional switch, there is a connection via an interconnection between the first ohmic electrodes, between the second ohmic electrodes, between the first gate electrodes, and between the second gate electrodes. The first ohmic electrodes, the second ohmic electrodes, the first gate electrodes, and the second gate electrodes are also connected via the interconnections to pads. In this case, a first gate electrode pad connected to the first gate electrodes and a second gate electrode pad connected to the second gate electrodes are located at diagonally opposite positions around the bidirectional switch. As a result, the four pads can be efficiently arranged.

In such an arrangement, however, in each unit cell, an interconnect distance between the first gate electrode and the first gate electrode pad and an interconnect distance between the second gate electrode and the second gate electrode pad are significantly different from each other, which is a problem. High power bidirectional switches generally have a chip area of several millimeters square. The distance between the interconnect distance between the first gate electrode and the first gate electrode pad and the interconnect distance between the second gate electrode and the second gate electrode pad is a maximum of about 3 mm. As the difference in the interconnect distance increases, the difference in the gate resistance also increases.

The first gate electrodes, the second gate electrodes, and the interconnections connected thereto are generally formed in the same step using the lift-off method. The lift-off method has difficulty in forming a thick metal film. Therefore, the first gate electrodes, the second gate electrodes, and the interconnections connected thereto each typically have a thickness of about 0.5 μm. If the metal film has a specific resistance of about $2 \times 10^{-6}$ Ω·cm and the interconnection has a width of about 50 μm, then when the difference in the interconnect distance is 3 mm, the difference in the gate resistance is 2.4Ω.

When a current is caused to flow bidirectionally between the first and second ohmic electrodes of the bidirectional switch, it is necessary to apply a bias voltage to both of the first and second gate electrodes so that the first and second gates are simultaneously turned on. In a unit cell having a large difference in the gate resistance, even if a bias voltage is simultaneously applied to the first and second gate electrode pads, the gate having a smaller gate resistance is turned on earlier, and the gate having a greater gate resistance is turned on later. In other words, there is a delay between a time required to turn on the first gate electrode and a time required to turn on the second gate electrode. When there is a delay in turning on, a current flows unidirectionally between the first and second ohmic electrodes in the unit cell during the delay time, which is rectification. During rectification, there is a voltage offset, resulting in a large switching loss. Moreover, when the first and second ohmic electrodes are disconnected, a current flows during the delay time, resulting in a large switching loss. Thus, when there is a unit cell having a large switching loss, the switching loss of the bidirectional switch which is the sum of those of the unit cells is also deteriorated. This problem becomes more significant as the switching frequency is increased. According to an estimation, the problem starts to manifest when the switching frequency exceeds 10 KHz.

It is an object of the present disclosure to solve the aforementioned problem to achieve a bidirectional switch in which an interconnect resistance between a first gate electrode and a second gate electrode included in each unit cell is small, whereby a switching loss is reduced.

Solution to the Problem

To achieve the object, the present disclosure provides a bidirectional switch in which a first gate electrode pad and a second gate electrode pad are arranged so that an interconnect resistance of a first gate electrode is substantially equal to an interconnect resistance of a second gate electrode.

Specifically, an illustrative bidirectional switch includes a plurality of unit cells including a semiconductor layer formed on a substrate, and a first ohmic electrode, a first gate electrode, a second gate electrode, and a second ohmic electrode successively formed on the semiconductor layer and spaced from each other, a first interconnection formed on the semiconductor layer, electrically connecting the first gate electrodes, and extending in a direction intersecting the first gate electrodes, a second interconnection formed on a side opposite to the first interconnection with the unit cells being interposed between the first and second interconnections, connecting the second gate electrodes, and extending in a direction intersecting the second gate electrodes, a first gate electrode pad electrically connected to the first interconnection, and a second gate electrode pad electrically connected to the second interconnection. Of the plurality of unit cells, one unit cell including a first gate electrode having a shortest interconnect distance from the first gate electrode pad, includes a second gate electrode having a shortest interconnect distance from the second gate electrode pad.

In the illustrative bidirectional switch, the unit cell including the first gate electrode having the shortest interconnect distance from the first gate electrode pad, includes the second gate electrode having the shortest interconnect distance from the second gate electrode pad. Therefore, there is not a unit cell which has a large difference between an interconnect distance between the first gate electrode and the first gate electrode pad and an interconnect distance between the second gate electrode and the second gate electrode pad. Therefore, in each unit cell, the interconnect resistance of the first gate electrode is substantially equal to the interconnect resistance of the second gate electrode, whereby a delay time caused by the difference in the interconnect resistance is not likely to occur. As a result, a bidirectional switch having a small switching loss can be achieved.

In the illustrative bidirectional switch, the first gate electrode pad may be formed at one end portion of the first interconnection, and the second gate electrode pad may be formed at one end portion of the second interconnection on the same side on which the first gate electrode pad is formed.

In this case, for an n-th unit cell and an (n+1)-th unit cell counted from a side on which the first gate electrode pad is formed, interconnect distances of the first gate electrodes and the second gate electrodes may have a relationship represented by:

$$|(L_{G1}(n+1)-L_{G1}(n))-(L_{G2}(n+1)-L_{G2}(n))|=2L_{G1G2}$$

where n is a natural number, $L_{G1}(n)$ is an interconnect distance between the first gate electrode included in the n-th unit cell and the first gate electrode pad, $L_{G1}(n+1)$ is an interconnect distance between the first gate electrode included in the (n+1)-th unit cell and the first gate electrode pad, $L_{G2}(n)$ is an interconnect distance between the second gate electrode included in the n-th unit cell and the second gate electrode pad, $L_{G2}(n+1)$ is an interconnect distance between the second gate electrode included in the (n+1)-th unit cell and the second gate electrode pad, and $L_{G1G2}$ is an interval between the first and second gate electrodes.

In the illustrative bidirectional switch, in each of the plurality of unit cells, an interconnect distance between the first gate electrode and the first gate electrode pad may be equal to an interconnect distance between the second gate electrode and the second gate electrode pad.

In the illustrative bidirectional switch, the first and second gate electrode pads may be symmetrical about a center line of the semiconductor substrate extending in a direction in which the first and second interconnections extend.

In the illustrative bidirectional switch, the first and second gate electrode pads may be symmetrical about a center point of the semiconductor substrate.

In the illustrative bidirectional switch, the first and second gate electrode pads may be unitary with the first and second interconnections, respectively.

The illustrative bidirectional switch may further include a first ohmic electrode pad electrically connected to the first ohmic electrode, and a second ohmic electrode pad electrically connected to the second ohmic electrode. The semiconductor layer may have an active region and a high-resistance region surrounding the active region. At least a portion of the first and second ohmic electrode pads may be formed on the active region.

In this case, at least a portion of the first and second gate electrode pads may be formed on the active region.

The illustrative bidirectional switch may further include a first ohmic electrode pad electrically connected to the first ohmic electrode, and a second ohmic electrode pad electrically connected to the second ohmic electrode. The second ohmic electrode pad may be formed on the semiconductor layer. The first ohmic electrode pad may be formed on a surface of the semiconductor substrate opposite to a surface of the semiconductor substrate on which the semiconductor layer is formed.

In the illustrative bidirectional switch, the semiconductor layer may include a first nitride semiconductor layer and a second nitride semiconductor layer having a larger band gap than that of the first nitride semiconductor layer, the first and second nitride semiconductor layers being successively formed, and the first nitride semiconductor layer being closer to the substrate than the second nitride semiconductor layer is.

Advantages of the Invention

According to the present disclosure, a bidirectional switch can be achieved in which a difference in interconnect resistance between a first gate electrode and a second gate electrode included in each unit cell is small, whereby a switching loss is reduced.

BRIEF DESCRIPTION OF THE DRAWINGS

FIG. 1(a) shows a plan view of a structure of the bidirectional switch, and FIG. 1(b) shows a cross-sectional view of the structure, taken along line Ib-Ib of FIG. 1(a).

FIG. 5(a) is a plan view, and FIG. 5(b) is a cross-sectional view taken along line Vb-Vb of FIG. 5(a).

FIG. 7(a) is a plan view, and FIG. 7(b) is a cross-sectional view taken along line VIIb-VIIb of FIG. 7(a).

DESCRIPTION OF EMBODIMENTS

First Embodiment

FIGS. 1(a) and 1(b) show a bidirectional switch according to a first embodiment. FIG. 1(a) shows a plan view of a structure of the bidirectional switch. FIG. 1(b) shows a cross-sectional view of the structure, taken along line Ib-Ib of FIG. 1(a).

Figure 1:
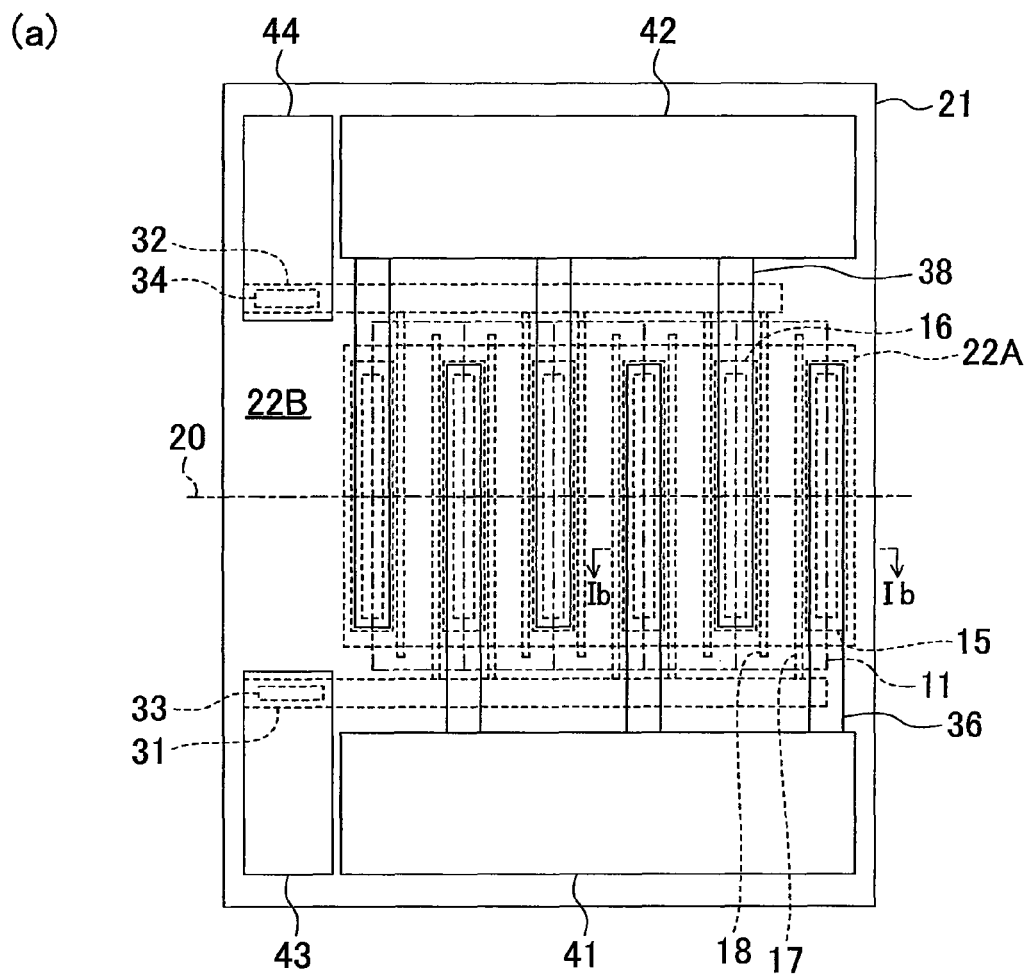
FIGS. 1(a) and 1(b) show a bidirectional switch according to a first embodiment.
Figure 1:
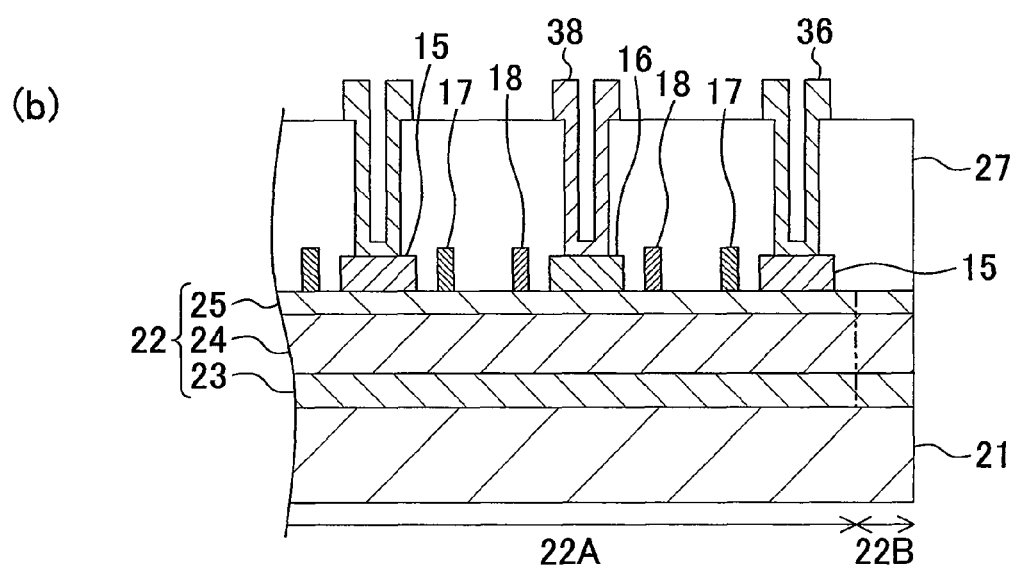

As shown in FIG. 1, the bidirectional switch of this embodiment has a double gate structure including first ohmic electrodes 15, second ohmic electrodes 16, first gate electrodes 17, and second gate electrodes 18, which are formed on a nitride semiconductor. In order to obtain a large gate width, a plurality of unit cells 11 each including a first ohmic electrode 15, a second ohmic electrode 16, a first gate electrode 17, and a second gate electrode 18 are connected in parallel.

A semiconductor layer 22 made of a nitride semiconductor is formed on a substrate 21, such as a silicon substrate or the like. The semiconductor layer 22 includes a buffer layer 23, a channel layer 24 made of i-GaN, and a barrier layer 25 made of i-AlGaN, which are successively formed, where the buffer layer 23 is the closest to the substrate 21. The compositions of the channel layer 24 and the barrier layer 25 may be arbitrarily changed if a channel made of two-dimensional electron gas is formed in the vicinity of an interface between the channel layer 24 and the barrier layer 25.

The semiconductor layer 22 has an active region 22A and a high-resistance region 22B surrounding the active region 22A. The high-resistance region 22B is caused to have a high resistance by ion implantation or the like. The finger-like first ohmic electrodes 15 and the finger-like second ohmic electrodes 16 are alternately arranged and spaced from each other on the active region 22A. A first gate electrode 17 and a second gate electrode 18, which are spaced from each other, are formed between a first ohmic electrode 15 and a second ohmic electrode 16.

A first ohmic electrode 15, a second ohmic electrode 16, a first gate electrode 17, and a second gate electrode 18 constitute a unit cell 11. Adjacent ones of the unit cells 11 share a first ohmic electrode 15 or a second ohmic electrode 16. In other words, the unit cells 11 are arranged and oriented in alternately reversed directions.

The first gate electrodes 17 and the second gate electrodes 18 are connected to a first interconnection 31 and a second interconnection 32, respectively, which are formed on the high-resistance region 22B. The first interconnection 31, which extends in a direction intersecting the first gate electrodes 17, electrically connects the first gate electrodes 17. The second interconnection 32, which extends in a direction intersecting the second gate electrodes 18, electrically connects the second gate electrodes 18. The first and second interconnections 31 and 32 are formed on opposite sides with the unit cells 11 are interposed therebetween.

The first and second gate electrodes 17 and 18, and the first and second interconnections 31 and 32 are made of, for example, a multilayer film including nickel (Ni) having a thickness of 100 nm and gold (Au) having a thickness of 400 nm. The first and second gate electrodes 17 and 18, and the first and second interconnections 31 and 32 can be simultaneously formed using the lift-off method.

An insulating film 27 is formed on the semiconductor layer 22, covering the first and second ohmic electrodes 15 and 16, and the first and second gate electrodes 17 and 18. A first ohmic electrode pad 41, a second ohmic electrode pad 42, a first gate electrode pad 43, and a second gate electrode pad 44 are formed on the insulating film 27. The first and second ohmic electrode pads 41 and 42, the first and second gate electrode pads 43 and 44 are formed on the high-resistance region 22B. The first and second ohmic electrode pads 41 and 42 are formed in opposite regions with the active region 22A being interposed therebetween, and the first and second gate electrode pads 43 and 44 are formed in opposite regions with the active region 22A being interposed therebetween. In other words, the first and second gate electrode pads 43 and 44 are formed at positions symmetrical about a center line 20 of the substrate 21 extending in a direction intersecting a direction in which the electrodes extends.

The first ohmic electrode pad 41 is connected to a third interconnection 36 formed on the insulating film 27. The third interconnection 36 is connected to the first ohmic electrodes 15 at openings formed in the insulating film 27. The second ohmic electrode pad 42 is connected to a fourth interconnection 38 formed on the insulating film 27. The fourth interconnection 38 is connected to the second ohmic electrodes 16 at openings formed in the insulating film 27.

The first and second ohmic electrode pads 41 and 42, and the third and second interconnections 36 and 38 may be made of, for example, a multilayer film including titanium (Ti) having a thickness of 100 nm and gold (Au) having a thickness of 5000 nm, and may be simultaneously formed by a plating process or the like.

The first gate electrode pad 43 is connected to the first interconnection 31 via a connection portion 33 which is formed in an opening which exposes the first interconnection 31. The second gate electrode pad 44 is connected to the second interconnection 32 via a connection portion 34 which is formed in an opening which exposes the second interconnection 32.

Figure 2:
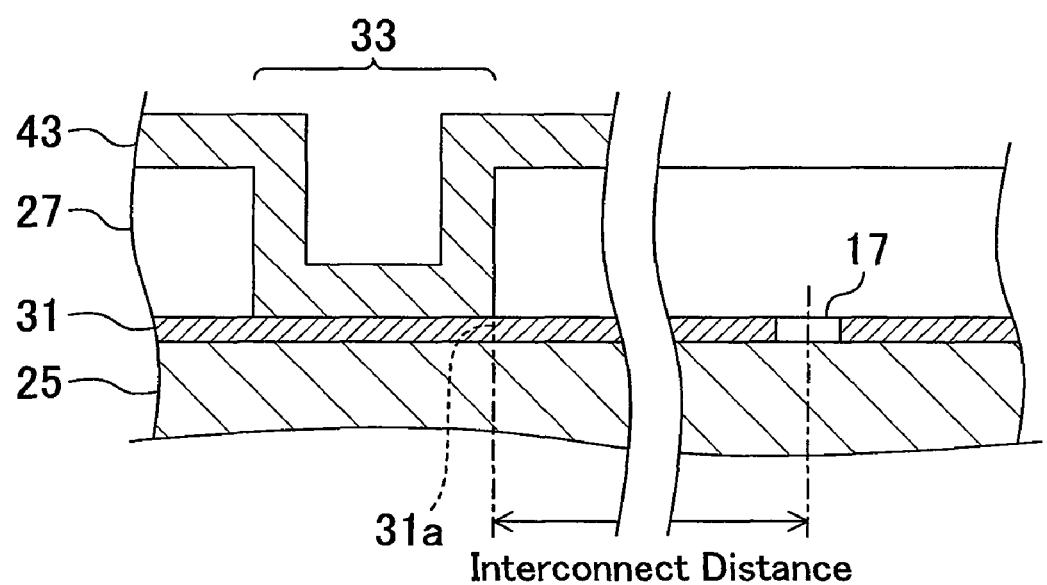
FIG. 2 is an enlarged cross-sectional view showing a connection portion between a first gate electrode pad and a first interconnection in the bidirectional switch of the first embodiment.

Attention now is directed to the first gate electrode pad 43, for example. The first gate electrode pad 43 and the first interconnection 31 are arranged as shown in FIG. 2. The first gate electrode pad 43 typically has the same material, thickness, and the like as those of the first and second ohmic electrode pads 41 and 42. Therefore, the first gate electrode pad 43 has a much smaller resistance than that of the first interconnection 31, and therefore, may be ignored in terms of the occurrence of the delay time. Therefore, the starting point of the interconnect distance of each first gate electrode 17 is an edge portion 31a at which the connection portion 33 contacts the first interconnection 31 as shown in FIG. 2. Similarly, the starting point of the interconnect distance of each second gate electrode 18 is an edge portion at which the connection portion 34 contacts the second interconnection 32.

In the bidirectional switch of this embodiment, the first gate electrode pad 43 is formed at one end portion of the first interconnection 31. The second gate electrode pad 44 is formed at one end portion of the second interconnection 32 that is located on the same side on which the first gate electrode pad 43 is formed. Therefore, a second gate electrode 18 which is included in a unit cell 11 which includes a first gate electrode 17 having the shortest interconnect distance to the first gate electrode pad 43 has the shortest interconnect distance to the second gate electrode pad 44.

In conventional bidirectional switches, the first and second gate electrode pads are arranged at diagonally opposite positions so as to reduce the area occupied by the pads. Therefore, the second gate electrode pad is formed at one end portion of the second interconnection that is opposite to the first gate electrode pad. Therefore, a second gate electrode included in a unit cell which includes a first gate electrode having the shortest interconnect distance to the first gate electrode pad, has the longest interconnect distance to the second gate electrode pad. A first gate electrode included in a unit cell which includes a second gate electrode having the shortest interconnect distance to the second gate electrode pad, has the longest interconnect distance to the first gate electrode pad. Therefore, there is a large difference between the interconnect resistance of the first gate electrode and the interconnect resistance of the second gate electrode, and therefore, there is a unit cell which has a large difference between a time required to turn on the first gate electrode and a time required to turn on the second gate electrode, i.e., a long delay time.

On the other hand, in the bidirectional switch of the first embodiment, in all unit cells, the difference between the interconnect distance from the first gate electrode 17 to the first gate electrode pad 43 and the interconnect distance from the second gate electrode 18 to the second gate electrode pad 44 can be reduced. Therefore, in each unit cell, the difference between the interconnect resistance of the first gate electrode and the interconnect resistance of the second gate electrode 18 can be reduced, and therefore, the difference between the time required to turn on the first gate electrode and the time required to turn on the second gate electrode, i.e., the delay time can be reduced. As a result, it is possible to achieve a bidirectional switch which doe not have a significant switching loss even when the switching frequency exceeds 10 KHz.

Figure 3:
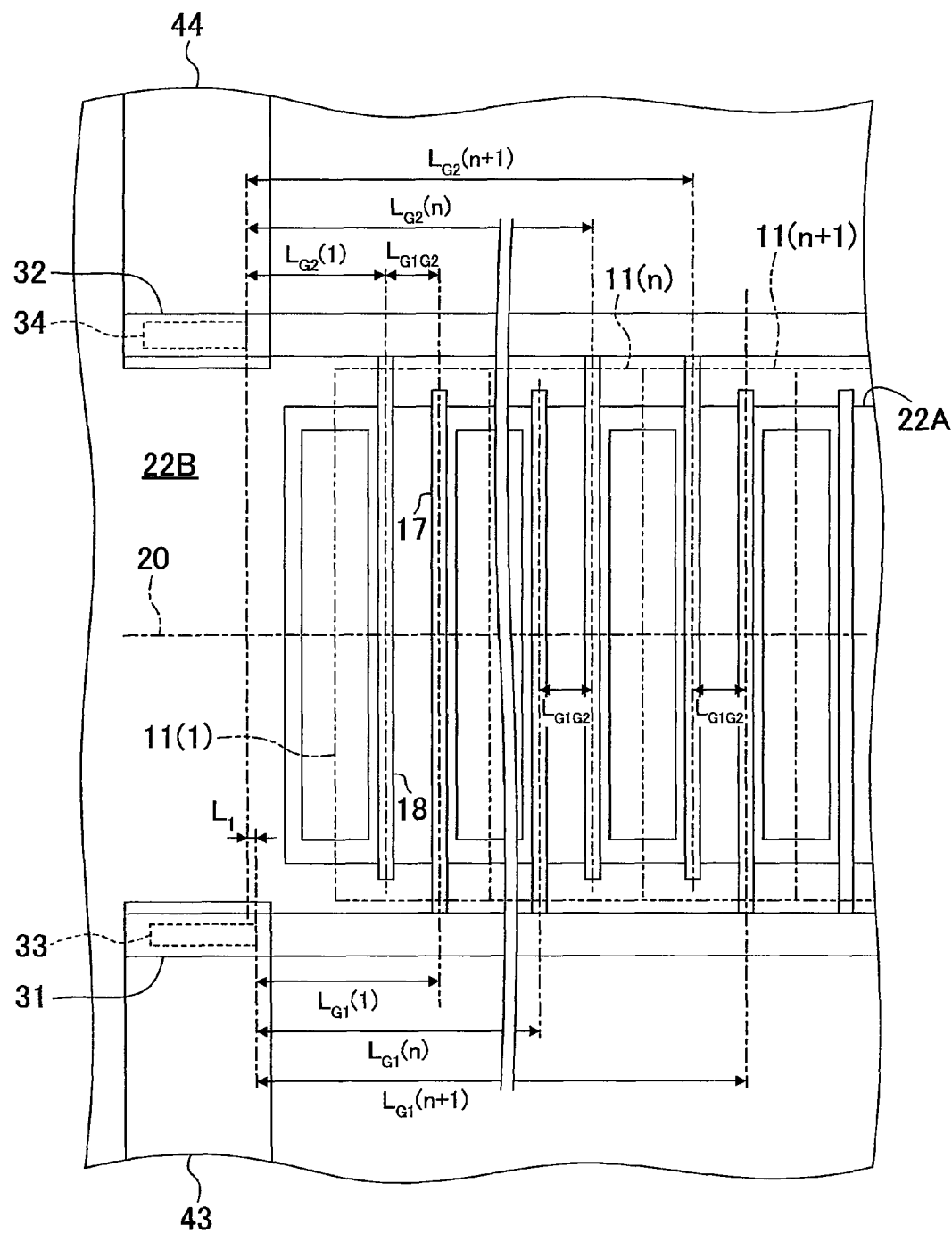
FIG. 3 is a plan view for describing a relationship between an interconnect distance of a first gate electrode and an interconnect distance of a second gate electrode in the bidirectional switch of the first embodiment.

As shown in FIG. 3, in the first unit cell 11(1) including a first gate electrode 17 having the shortest interconnect distance from the first gate electrode pad 43, if an interconnect distance between the first gate electrode 17 and the first gate electrode pad 43 is represented by $L_{G1}(1)$, an interconnect distance $L_{G2}(1)$ between the second gate electrode 18 and the second gate electrode pad 44 can be represented by:

$$L_{G2}(1)=L_{G1}(1)+L_1-L_{G1G2} \qquad (1)$$

where $L_1$ is a positional offset between the edge portion at which the connection portion 33 of the first gate electrode pad 43 contacts the first interconnection 31 and the edge portion at which the connection portion 34 of the second gate electrode pad 44 contacts the second interconnection 32, i.e., an offset between the starting point of the interconnect distance of the first gate electrode 17 and the starting point of the interconnect distance of the second gate electrode 18, and $L_{G1G2}$ is an interval between the first and second gate electrodes 17 and 18.

If the first and second gate electrode pads 43 and 44 are arranged to be symmetrical about the center line 20 of the substrate 21, the offset $L_1$ between the starting point of the interconnect distance of the first gate electrode 17 and the starting point of the interconnect distance of the second gate electrode 18 can be caused to be substantially zero. Therefore, the difference between the interconnect distance of the first gate electrode 17 and the interconnect distance of the second gate electrode 18 in the first unit cell 11(1) can be caused to be substantially equal to the interval $L_{G1G2}$ between the first and second gate electrodes 17 and 18.

The unit cells 11 are arranged and oriented in alternately reversed directions. Therefore, in the second unit cell, the sign of $L_{G1G2}$ in expression (1) is reversed. However, also in this case, the difference between the interconnect distance of the first gate electrode 17 and the interconnect distance of the second gate electrode 18 in the second unit cell is substantially equal to the interval $L_{G1G2}$ between the first and second gate electrodes 17 and 18. Moreover, when the offset $L_1$ between the starting point of the interconnect distance of the first gate electrode 17 and the starting point of the interconnect distance of the second gate electrode 18 is exactly zero, the difference between the interconnect distance of the first gate electrode 17 and the interconnect distance of the second gate electrode 18 in the first unit cell 11(1) is equal to the interval $L_{G1G2}$ between the first and second gate electrodes 17 and 18 in any case.

The interval $L_{G1G2}$ between the first and second gate electrodes 17 and 18 is about 10 μm. In the case of such a difference, the delay time due to the difference in gate resistance between the first and second gate electrodes 17 and 18 is considerably small. As a result, a switching loss in the bidirectional switch due to the delay time can be reduced.

Attention now is directed to an n-th unit cell 11(n) and an (n+1)-th unit cell 11(n+1). In this case, the following relationship is established:

$$|(L_{G1}(n+1)-L_{G1}(n))-(L_{G2}(n+1)-L_{G2}(n))|=2L_{G1G2} \quad (2)$$

In conventional bidirectional switches in which the second gate electrode pad is formed on a side of the second interconnection opposite to the first gate electrode pad, such a relationship is not established.

As the positional offset between the edge portion at which the first gate electrode pad 43 contacts the first interconnection 31 and the edge portion at which the second gate electrode pad 44 contacts the second interconnection 32 decreases, variations in the interconnect distance of the first gate electrode 17 and the interconnect distance of the second gate electrode 18 among the unit cells 11 can be reduced to a smaller degree. However, a problem does not arise even when the positional offset is about 20 μm or more, although such a value varies depending on the interconnect thickness or width, the specific resistance of the interconnect material, the interval between the first and second gate electrodes, or the like.

Figure 4:
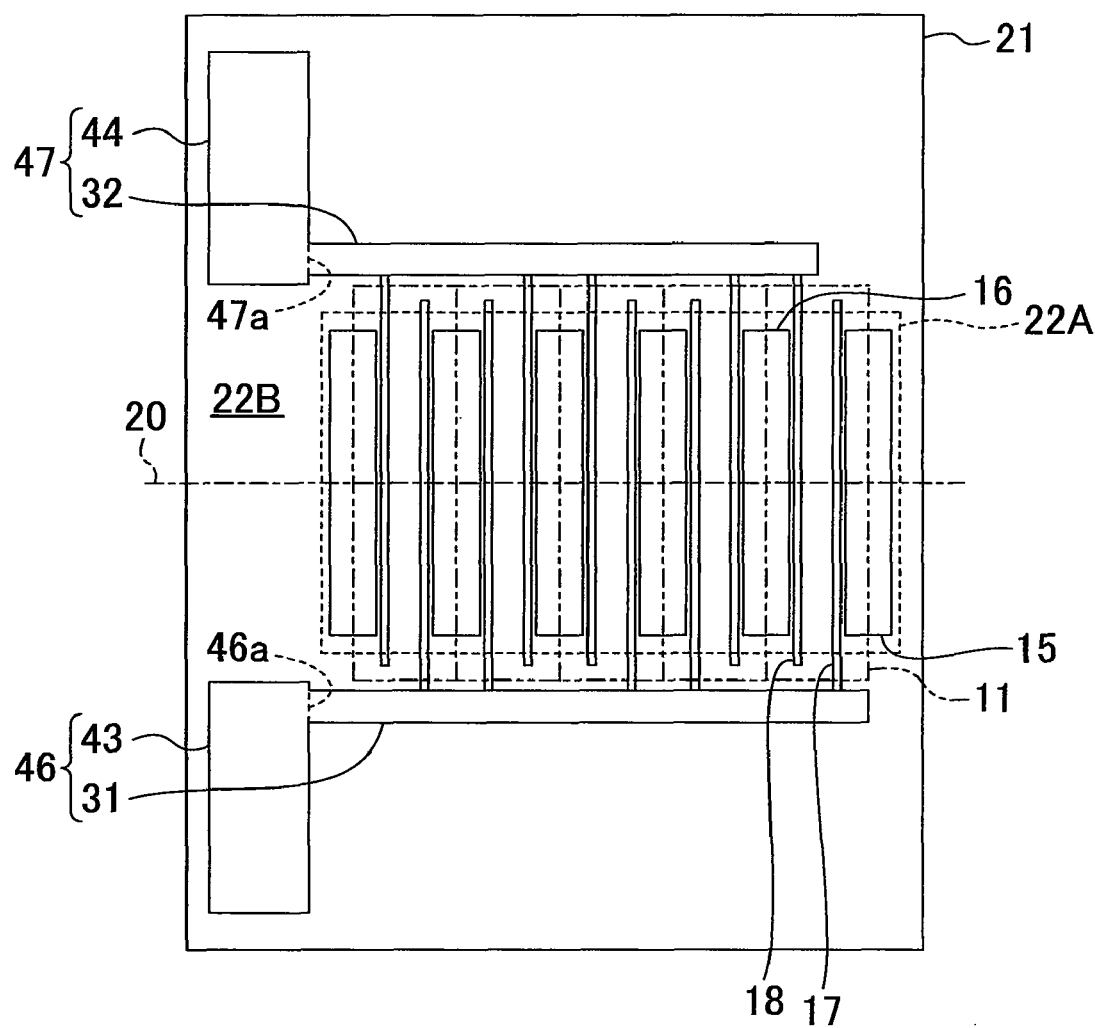
FIG. 4 is a plan view showing a variation of the bidirectional switch of the first embodiment.

FIG. 1 shows an example in which the first and second gate electrode pads 43 and 44 are formed on the insulating film 27. Alternatively, as shown in FIG. 4, the first and second gate electrode pads 43 and 44 can be formed directly on the high-resistance region 22B. In this case, the first gate electrode pad 43 is formed as a conductive film 46 in which the first gate electrode pad 43 is unitary with the first interconnection 31, and the second gate electrode pad 44 is formed as a conductive film 47 in which the second gate electrode pad 44 is unitary with the second interconnection 32. Specifically, the first gate electrode pad 43 is a portion having a broader width of the conductive film 46, and the first interconnection 31 is a portion having a narrower width of the conductive film 46. Similarly, the second gate electrode pad 44 is a portion having a broader width of the conductive film 47, and the second interconnection 32 is a portion having a narrower width of the conductive film 47. Note that, in FIG. 4, the insulating film 27, the first and second ohmic electrode pads 41 and 42, and the third and fourth interconnections 36 and 38 are not shown.

The first and second gate electrode pads 43 and 44, and the first and second interconnections 31 and 32 have the same material and thickness. However, the first and second gate electrode pads 43 and 44 have a much larger width than that of the first and second interconnections 31 and 32. Therefore, the first and second gate electrode pads 43 and 44 have a negligibly small resistance compared to that of the first and second interconnections 31 and 32. Therefore, the starting point of the interconnect distance of each first gate electrode 17 is a boundary portion 46a between the first gate electrode pad 43 and the first interconnection 31 at which the width of the conductive film 46 is narrowed. The starting point of the interconnect distance of each second gate electrode 18 is a boundary portion 47a between the second gate electrode pad 44 and the second interconnection 32 at which the width of the conductive film 47 is narrowed.

Note that a metal film for bonding may be further provided on a portion of the conductive film 46 which is to be the first gate electrode pad 43 and a portion of the conductive film 47 which is to be the second gate electrode pad 44. In this case, the first and second gate electrode pads 43 and 44 have a still smaller resistance.

Figure 5:
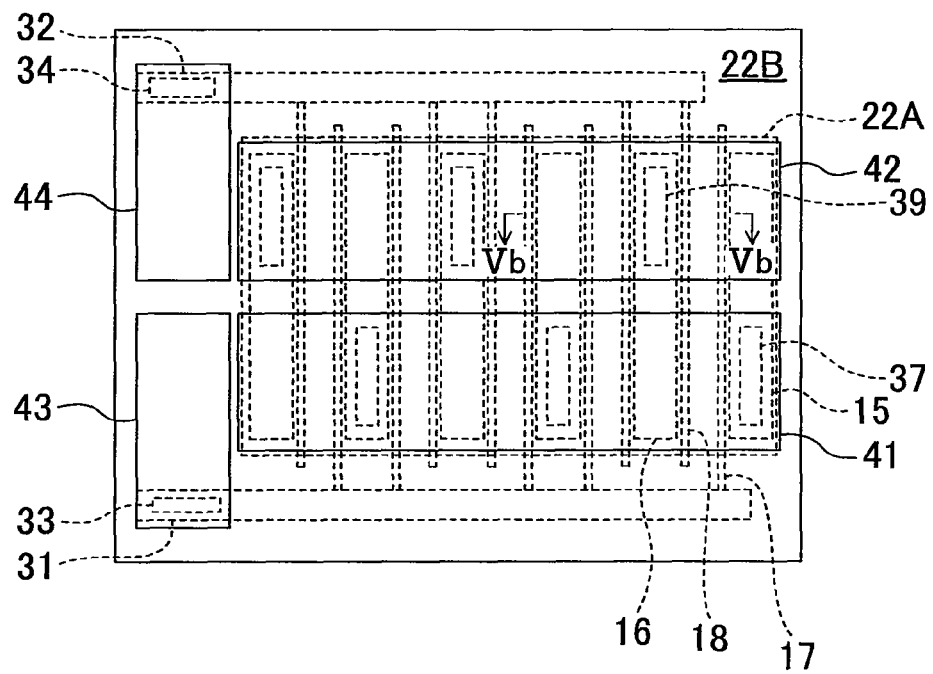
FIGS. 5(a) and 5(b) show a variation of the bidirectional switch of the first embodiment of the present invention.
Figure 5:
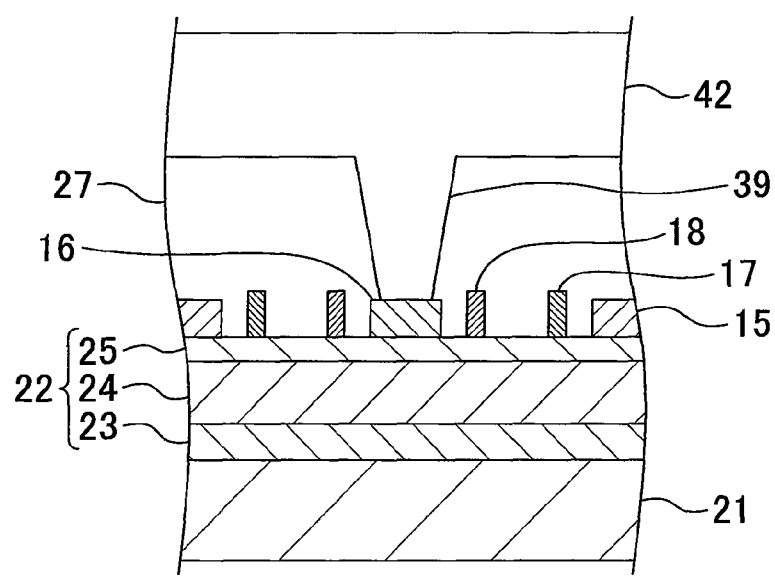

FIGS. 1 and 4 show an example in which the first and second ohmic electrode pads 41 and 42 are formed on the high-resistance region 22B. Alternatively, as shown in FIG. 5, at least a portion of the first and second ohmic electrode pads 41 and 42 may be formed on the active region 22A. Such a so-called pad-on-chip structure can reduce the area occupied by the bidirectional switch.

In this case, the first ohmic electrode 15 and the first ohmic electrode pad 41 may be directly connected via a connection portion 37, and the second ohmic electrode 16 and the second ohmic electrode pad 42 may be directly connected via a connection portion 39. In this case, the connection portion 37 between the first ohmic electrode 15 and the first ohmic electrode pad 41 and the connection portion 39 between the second ohmic electrode 16 and the second ohmic electrode pad 42 may have a length which is approximately smaller than or equal to the half of the length of the first ohmic electrode 15 and the second ohmic electrode 16, respectively.

Figure 6:
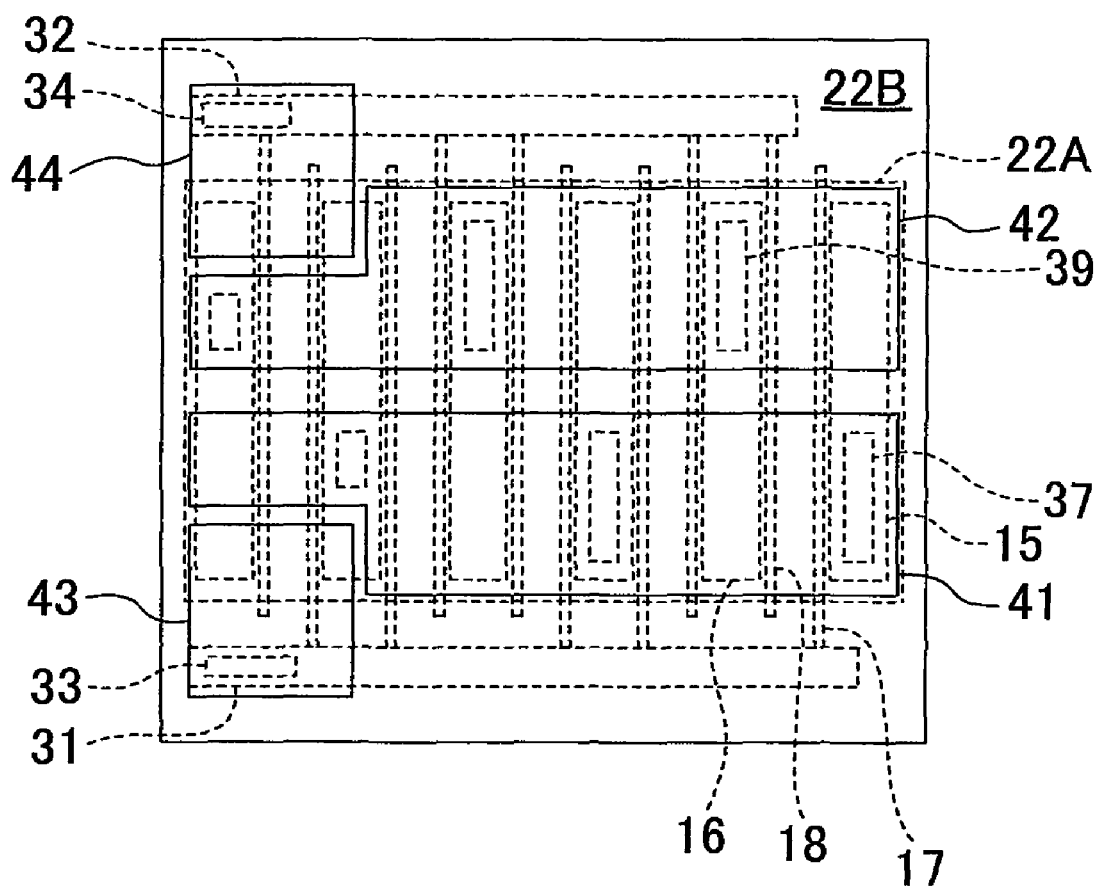
FIG. 6 is a plan view showing a variation of the bidirectional switch of the first embodiment.

Moreover, as shown in FIG. 6, at least a portion of the first and second gate electrode pads 43 and 44 may be formed on the active region 22A. FIG. 6 shows an example in which no less than the half of the area of each of the first and second gate electrode pads 43 and 44 is formed on the active region 22A.

Figure 7:
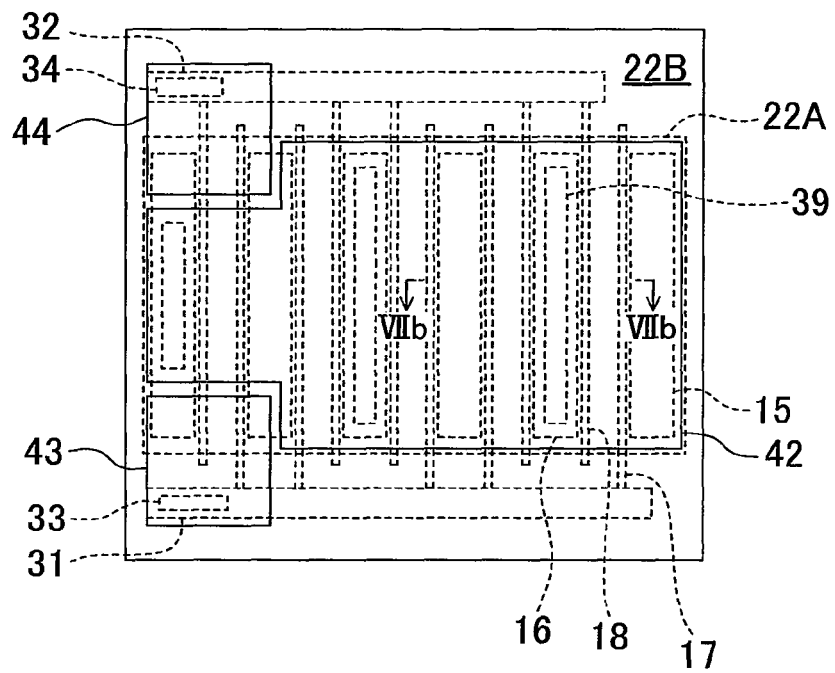
FIGS. 7(a) and 7(b) show a variation of the bidirectional switch of the first embodiment of the present invention.
Figure 7:
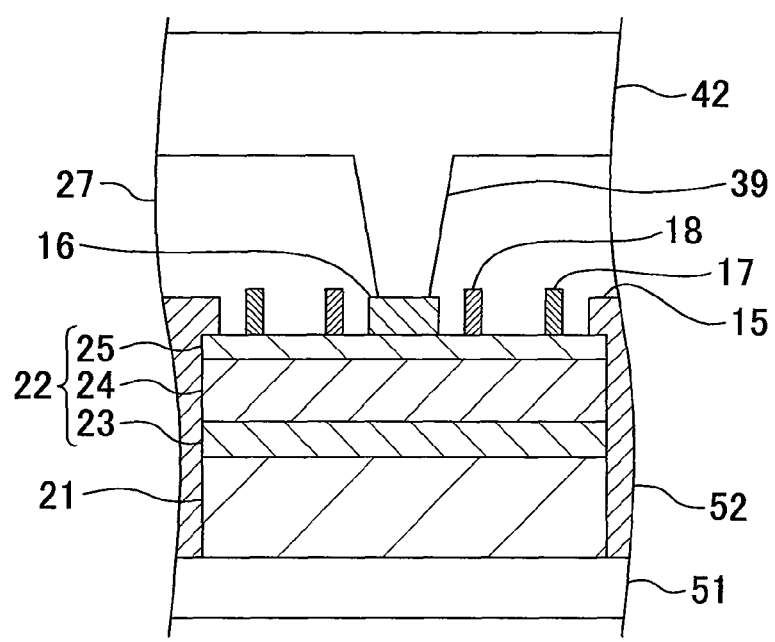

Moreover, as shown in FIG. 7, the first ohmic electrode pad 41 may be a back surface electrode 51 which is formed on a back surface of the substrate 21. In this case, the back surface electrode 51 and the first ohmic electrodes 15 may be connected via metal 52 provided in via holes penetrating the semiconductor layer 22 and the substrate 21. Such a structure does not require the wiring of the first ohmic electrodes 15, and therefore, can simplify the assembly process.

Second Embodiment

Figure 8:
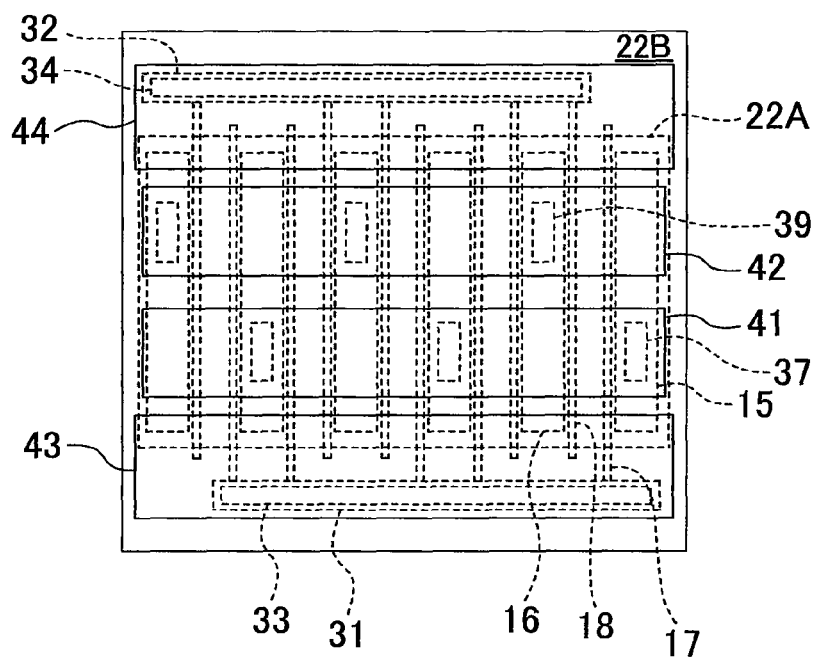
FIG. 8 is a plan view showing a bidirectional switch according to a second embodiment.

A second embodiment will be described hereinafter with reference to the drawings. FIG. 8 shows a plan view of a structure of a bidirectional switch according to the second embodiment. In FIG. 8, the same components as those of FIG. 1 are indicated by the same reference characters and will not be described.

In the bidirectional switch of the second embodiment, as shown in FIG. 8, the first gate electrode pad 43 is formed, covering an entirety of the first interconnection 31, and the second gate electrode pad 44 is formed, covering an entirety of the second interconnection 32. The first gate electrode pad 43 is coupled to substantially the entirety of the first interconnection 31, and the second gate electrode pad 44 is coupled to substantially the entirety of the second interconnection 32.

As a result, the unit cells 11 have substantially an equal interconnect distance between the first gate electrode 17 and the first gate electrode pad 43. The unit cells 11 also have substantially an equal interconnect distance between the second gate electrode 18 and the second gate electrode pad 44. Moreover, by causing the distance between the first interconnection 31 and the active region 22A and the distance between the second interconnection 32 and the active region 22A to be equal to each other, the interconnect distance between the first gate electrode 17 and the first gate electrode pad 43 and the interconnect distance between the second gate electrode 18 and the second gate electrode pad 44 can be caused to be substantially equal to each other.

Moreover, the proportion of the first interconnection 31 in a wire between the first gate electrodes 17 and the first gate electrode pad 43 and the proportion of the second interconnection 32 in a wire between the second gate electrodes 18 and the second gate electrode pad 44 are substantially negligibly small.

Therefore, the interconnect resistance between the first gate electrodes 17 and the first gate electrode pad 43 and the interconnect resistance between the second gate electrodes 18 and the second gate electrode pad 44 can be reduced to a negligibly small level. For example, when the first and second gate electrode pads 43 and 44 are a multilayer film including a Ti film having a thickness of 100 nm and a Au film having a thickness of 5000 nm, and have a specific resistance of about $2\times10^{-6}$ Ωcm, a pad width of 100 μM, and a pad length of 3 mm, the interconnect resistance is about 0.12Ω. As a result, in all unit cells, a difference in signal delay time between the first and second gate electrodes 17 and 18 is negligible, and therefore, the loss of the bidirectional switch can be significantly reduced.

Figure 9:
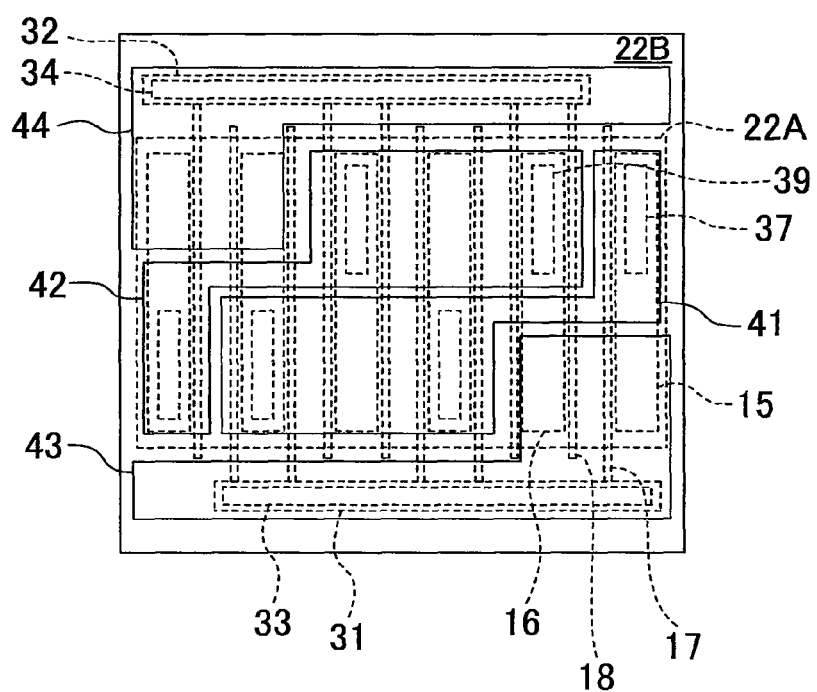
FIG. 9 is a plan view showing a variation of the bidirectional switch of the second embodiment.

The shape of the first and second gate electrode pads 43 and 44 may be arbitrarily changed if the first gate electrode pad 43 can be coupled to substantially the entirety of the first interconnection 31 and the second gate electrode pad 44 can be coupled to substantially the entirety of the second interconnection 32. For example, as shown in FIG. 9, a portion of each of the first and second gate electrode pads 43 and 44 may be formed on the active region 22A. In this case, the areas of the first and second gate electrode pads 43 and 44 can be increased without increasing the chip area of the bidirectional switch. Moreover, the first and second gate electrode pads 43 and 44, and the first and second ohmic electrode pads 41 and 42 may be convoluted and intertwined, whereby a region for bonding a thick wire to all the electrode pads can be provided. As a result, a large current can be passed.

Figure 10:
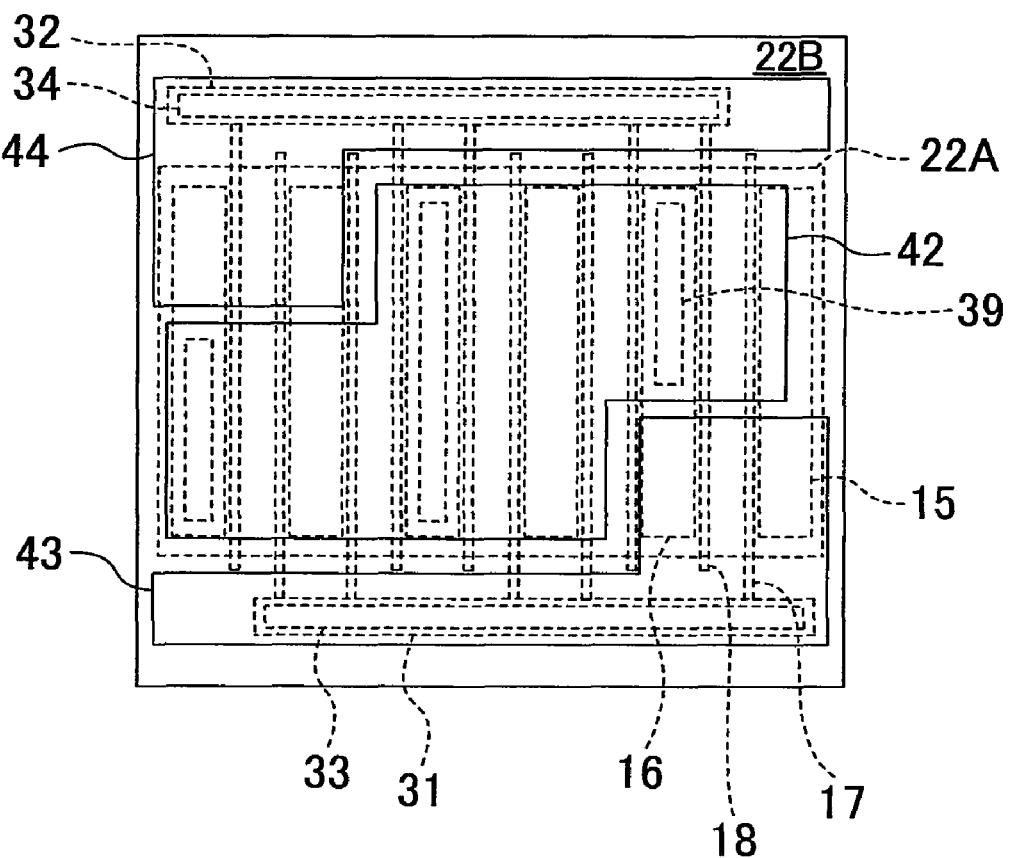
FIG. 10 is a plan view showing a variation of the bidirectional switch of the second embodiment.
Figure 11:
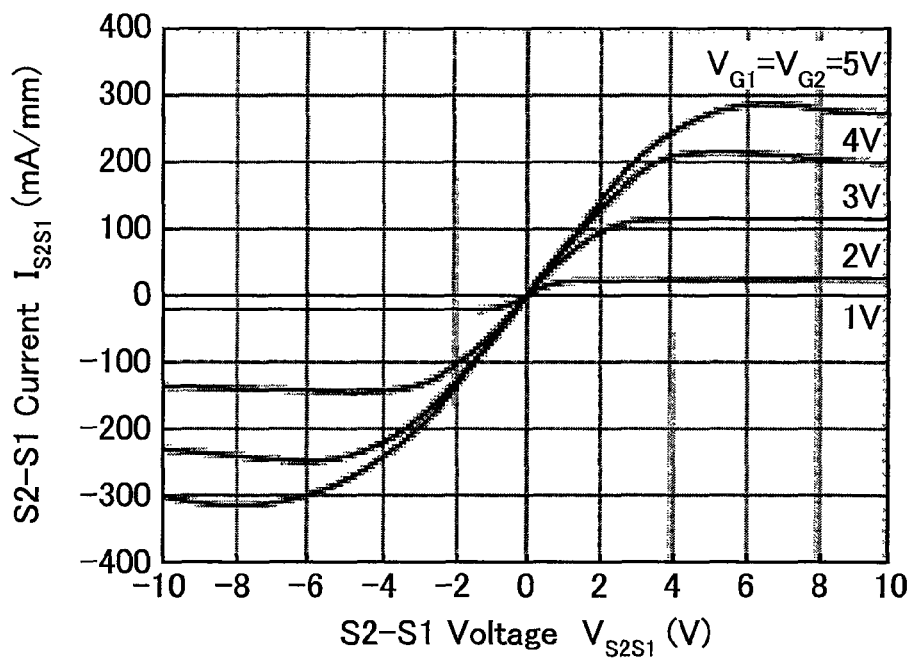
FIGS. 11(a) and 11(b) are graphs showing current-voltage characteristics of a bidirectional switch.
Figure 11:
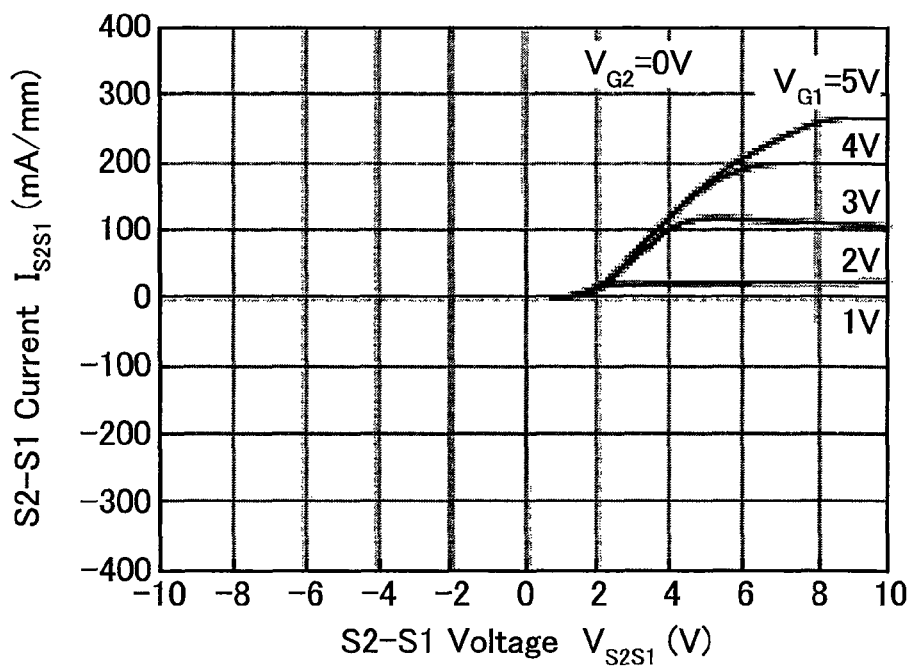

Alternatively, as shown in FIG. 10, the first ohmic electrode pad 41 may be formed on a back surface of the substrate 21. In this case, wiring is not required for the first ohmic electrode pad 41, and therefore, the assembly process can be simplified.

In each embodiment, an example has been described where the first gate electrodes 17 and the second gate electrodes 18 are a multilayer film of Ni and Au, and therefore, form a Schottky junction with the barrier layer 25. Alternatively, a gate injection transistor (GIT) structure may be employed. In this case, a p-type semiconductor layer made of AlGaN or GaN may be formed between the barrier layer 25, and the first and second gate electrodes 17 and 18 so that the first and second gate electrodes 17 and 18 form an ohmic junction with the p-type semiconductor layer. Such a structure can easily provide a normally-off characteristic and a low on-resistance. Alternatively, the normally-off characteristic and the low on-resistance may be achieved using a Schottky junction, a metal-insulating film-semiconductor (MIS) structure, or the like.

While, in each embodiment, an example has been described where the semiconductor layer is formed on a Si substrate, the semiconductor layer may be formed of a substrate made of other materials, such as SiC, sapphire, GaN, and the like.

While, in each embodiment, an example has been described where the bidirectional switch is formed of a nitride semiconductor, typified by GaN, SiC, which is a wide band gap semiconductor, may be employed. Alternatively, arsenide-based semiconductors, typified by GaAs, which are often used in high-frequency devices may be employed.

INDUSTRIAL APPLICABILITY

In the bidirectional switch of the present disclosure, a difference in interconnect resistance between a first gate electrode and a second gate electrode in each unit cell is small, and therefore, a switching loss is reduced. Therefore, the present disclosure is useful for bidirectional switches having a double gate structure which employ a wide band gap semiconductor, and the like.

DESCRIPTION OF REFERENCE CHARACTERS

11 Unit Cell
15 First Ohmic Electrode
16 Second Ohmic Electrode
17 First Gate Electrode
18 Second Gate Electrode
20 Center Line
21 Substrate
22 Semiconductor Layer
22a Active Region
22b High-Resistance Region
23 Buffer Layer
24 Channel Layer
25 Barrier Layer
27 Insulating Film
31 First Interconnection
32 Second Interconnection
33 Connection Portion
34 Connection Portion
36 Third Interconnection
37 Connection Portion
38 Fourth Interconnection
39 Connection Portion
41 First Ohmic Electrode Pad
42 Second Ohmic Electrode Pad
43 First Gate Electrode Pad
44 Second Gate Electrode Pad
51 Back Surface Electrode
52 Metal

The invention claimed is:

1. A bidirectional switch comprising:
a plurality of unit cells including a semiconductor layer formed on a substrate, and a first ohmic electrode, a first gate electrode, a second gate electrode, and a second ohmic electrode successively formed on the semiconductor layer and spaced from each other;
a first interconnection formed on the semiconductor layer, electrically connecting the first gate electrodes, and extending in a direction intersecting the first gate electrodes;
a second interconnection formed on a side opposite to the first interconnection with the unit cells being interposed between the first and second interconnections, connecting the second gate electrodes, and extending in a direction intersecting the second gate electrodes;
a first gate electrode pad electrically connected to the first interconnection; and
a second gate electrode pad electrically connected to the second interconnection,
wherein
the entire first interconnection is overlapped by the first gate electrode pad in plan view, and
the entire second interconnection is overlapped by the second gate electrode pad in plan view.

2. The bidirectional switch of claim 1, wherein in each of the plurality of unit cells, an interconnect distance between the first gate electrode and the first gate electrode pad is equal to an interconnect distance between the second gate electrode and the second gate electrode pad.

3. The bidirectional switch of claim 1, wherein the first and second gate electrode pads are symmetrical about a center line of the semiconductor substrate extending in a direction in which the first and second interconnections extend.

4. The bidirectional switch of claim 2, wherein the first and second gate electrode pads are symmetrical about a center point of the semiconductor substrate.

5. The bidirectional switch of claim 1, wherein the first and second gate electrode pads are unitary with the first and second interconnections, respectively.

6. The bidirectional switch of claim 1, further comprising:
a first ohmic electrode pad electrically connected to the first ohmic electrode; and
a second ohmic electrode pad electrically connected to the second ohmic electrode,
wherein
the semiconductor layer has an active region and a high-resistance region surrounding the active region, and
at least a portion of the first and second ohmic electrode pads is formed on the active region.

7. The bidirectional switch of claim 6, wherein at least a portion of the first and second gate electrode pads is formed on the active region.

8. The bidirectional switch of claim 1, further comprising:
a first ohmic electrode pad electrically connected to the first ohmic electrode; and
a second ohmic electrode pad electrically connected to the second ohmic electrode,
wherein
the second ohmic electrode pad is formed on the semiconductor layer, and
the first ohmic electrode pad is formed on a surface of the semiconductor substrate opposite to a surface of the semiconductor substrate on which the semiconductor layer is formed.

9. The bidirectional switch of claim 1, wherein the semiconductor layer includes a first nitride semiconductor layer and a second nitride semiconductor layer having a larger band gap than that of the first nitride semiconductor layer, the first and second nitride semiconductor layers being successively formed, and the first nitride semiconductor layer being closer to the substrate than the second nitride semiconductor layer is.

10. The bidirectional switch of claim 1, wherein a portion of the first ohmic electrode is overlapped by the first gate electrode pad in plan view.

11. The bidirectional switch of claim 10, wherein a portion of the second ohmic electrode is overlapped by the first gate electrode pad in plan view.

* * * * *